(12) United States Patent
Hu

(10) Patent No.: US 12,236,708 B2
(45) Date of Patent: *Feb. 25, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Yao Hu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/495,255

(22) Filed: Oct. 26, 2023

(65) Prior Publication Data

US 2024/0054807 A1 Feb. 15, 2024

Related U.S. Application Data

(63) Continuation of application No. 17/610,223, filed as application No. PCT/CN2021/073725 on Jan. 26, 2021, now Pat. No. 11,869,268.

(51) Int. Cl.
*G06F 3/041* (2006.01)
*G06V 10/141* (2022.01)
(Continued)

(52) U.S. Cl.
CPC ........ *G06V 40/1318* (2022.01); *G06F 3/0412* (2013.01); *G06V 10/141* (2022.01);
(Continued)

(58) Field of Classification Search
CPC ... G06F 3/0412; G06F 3/0421; G09G 3/3225; G09G 2300/0426; G09G 2300/0452;
(Continued)

(56) References Cited

U.S. PATENT DOCUMENTS 8,884,944 B2 11/2014 Niioka et al.
10,209,568 B2 2/2019 Zhou
(Continued)

FOREIGN PATENT DOCUMENTS

CN 101266759 A 9/2008
CN 102280074 A 12/2011
(Continued)

OTHER PUBLICATIONS

Extended European Search Report for European Application No. EP-21922429.2, dated Aug. 4, 2023.
(Continued)

*Primary Examiner* — Joe H Cheng
(74) *Attorney, Agent, or Firm* — LEASON ELLIS LLP

(57) ABSTRACT

A display panel and a display device are provided, the display panel has a first surface on a surface of the display panel, and includes a driving circuit layer, a light source array, an image sensor array, and a black matrix layer. The light source array includes a plurality of light sources, the image sensor array includes a plurality of image sensors, the black matrix layer includes first light-transmitting openings and second light-transmitting openings. The driving circuit layer includes light-transmitting portions, and each of the first light-transmitting openings is arranged corresponding to at least one of the light-transmitting portions, and a plane size of the first light-transmitting opening in a direction parallel to the surface of the display panel is smaller than a plane size of the light-transmitting portion in the direction parallel to the surface of the display panel.

20 Claims, 7 Drawing Sheets

(51) Int. Cl.
  *G06V 10/143* (2022.01)
  *G06V 40/13* (2022.01)
  *H10K 59/131* (2023.01)
  *H10K 59/40* (2023.01)
  *H10K 59/65* (2023.01)
  *H10K 59/80* (2023.01)
  *G06F 3/042* (2006.01)
  *G09G 3/3225* (2016.01)

(52) U.S. Cl.
  CPC ....... *G06V 10/143* (2022.01); *H10K 59/1315* (2023.02); *H10K 59/40* (2023.02); *H10K 59/65* (2023.02); *H10K 59/8792* (2023.02); *G06F 3/0421* (2013.01); *G09G 3/3225* (2013.01); *G09G 2300/0426* (2013.01); *G09G 2300/0452* (2013.01); *G09G 2300/0842* (2013.01); *G09G 2354/00* (2013.01)

(58) Field of Classification Search
  CPC ....... G09G 2300/0842; G09G 2354/00; G06V 10/141; G06V 10/143; G06V 40/1318; H10K 59/40; H10K 59/65; H10K 59/8792
  See application file for complete search history.

(56) References Cited

U.S. PATENT DOCUMENTS

| | | | |
|---|---|---|---|
| 10,310,663 | B2 | 6/2019 | Fukushima |
| 10,417,477 | B2 | 9/2019 | Ko et al. |
| 10,679,559 | B2 | 6/2020 | Ding et al. |
| 10,803,258 | B2 | 10/2020 | Kenney |
| 10,803,285 | B2 | 10/2020 | Zhao et al. |
| 10,845,902 | B2 | 11/2020 | Clark et al. |
| 10,943,955 | B2 | 3/2021 | Wang et al. |
| 10,978,516 | B2 | 4/2021 | Shao et al. |
| 11,088,219 | B2 | 8/2021 | Ryu et al. |
| 11,271,183 | B2 | 3/2022 | Zeng et al. |
| 11,348,356 | B2 | 5/2022 | Chan et al. |
| 11,657,640 | B2 | 5/2023 | Lu et al. |
| 11,721,122 | B2 | 8/2023 | Xu et al. |
| 2011/0285680 | A1 | 11/2011 | Nakamura |
| 2012/0182277 | A1 | 7/2012 | Jeong et al. |
| 2014/0176893 | A1 | 6/2014 | Sugitani et al. |
| 2015/0362165 | A1 | 12/2015 | Chu et al. |
| 2016/0291741 | A1 | 10/2016 | Zhou et al. |
| 2017/0185196 | A1 | 6/2017 | Kim et al. |
| 2017/0277219 | A1 | 9/2017 | Chung et al. |
| 2019/0245017 | A1 | 8/2019 | Haseok et al. |
| 2020/0026377 | A1 | 1/2020 | Gwon et al. |
| 2020/0034600 | A1 | 1/2020 | Chan et al. |
| 2020/0105841 | A1 | 4/2020 | Bang et al. |
| 2020/0203453 | A1 | 6/2020 | Kin et al. |
| 2020/0343477 | A1 | 10/2020 | Zeng et al. |
| 2021/0066404 | A1 | 3/2021 | Huang |
| 2021/0232841 | A1 | 7/2021 | Wang et al. |
| 2021/0320130 | A1 | 10/2021 | Xian et al. |
| 2021/0335910 | A1 | 10/2021 | Tan et al. |
| 2021/0373704 | A1 | 12/2021 | Wang et al. |
| 2021/0376003 | A1 | 12/2021 | Xu et al. |
| 2021/0397806 | A1 | 12/2021 | Lu et al. |
| 2022/0011482 | A1 | 1/2022 | Wang et al. |
| 2022/0035487 | A1 | 2/2022 | Wang et al. |
| 2022/0052139 | A1 | 2/2022 | Xu |
| 2022/0069027 | A1 | 3/2022 | Wang et al. |
| 2022/0129131 | A1 | 4/2022 | Liu et al. |
| 2022/0376215 | A1 | 11/2022 | Gao et al. |
| 2023/0015554 | A1 | 1/2023 | Zhu et al. |

FOREIGN PATENT DOCUMENTS

| | | |
|---|---|---|
| CN | 102722030 A | 10/2012 |
| CN | 104037201 A | 9/2014 |
| CN | 104699356 A | 6/2015 |
| CN | 205281463 U | 6/2016 |
| CN | 106598327 A | 4/2017 |
| CN | 206076238 U | 4/2017 |
| CN | 107065360 A | 8/2017 |
| CN | 107622990 A | 1/2018 |
| CN | 108288681 A | 7/2018 |
| CN | 109144311 A | 1/2019 |
| CN | 109728044 A | 5/2019 |
| CN | 109782965 A | 5/2019 |
| CN | 110061042 A | 7/2019 |
| CN | 110137206 A | 8/2019 |
| CN | 110187544 A | 8/2019 |
| CN | 110321029 A | 10/2019 |
| CN | 110349528 A | 10/2019 |
| CN | 110416272 A | 11/2019 |
| CN | 110518052 A | 11/2019 |
| CN | 110534551 A | 12/2019 |
| CN | 110728267 A | 1/2020 |
| CN | 110737354 A | 1/2020 |
| CN | 111106153 A | 5/2020 |
| CN | 111162110 A | 5/2020 |
| CN | 111312792 A | 6/2020 |
| CN | 111415960 A | 7/2020 |
| CN | 111564571 A | 8/2020 |
| CN | 111599846 A | 8/2020 |
| CN | 111665999 A | 9/2020 |
| CN | 111668388 A | 9/2020 |
| CN | 111694189 A | 9/2020 |
| CN | 111725264 A | 9/2020 |
| CN | 111799320 A | 10/2020 |
| CN | 111831172 A | 10/2020 |
| CN | 112103328 A | 12/2020 |
| CN | 112186022 A | 1/2021 |
| CN | 112259584 A | 1/2021 |
| CN | 112313802 A | 2/2021 |
| CN | 112363636 A | 2/2021 |
| CN | 112531006 A | 3/2021 |
| CN | 112534583 A | 3/2021 |
| CN | 112654917 A | 4/2021 |
| CN | 112673477 A | 4/2021 |
| CN | 113327966 A | 8/2021 |
| CN | 215578574 U | 1/2022 |
| CN | 215834530 U | 2/2022 |
| CN | 215834552 U | 2/2022 |
| EP | 2348388 A1 | 7/2011 |
| EP | 3089149 A1 | 11/2016 |
| JP | 2018032171 A | 3/2018 |
| KR | 20190037391 A | 4/2019 |
| WO | 2020220302 A1 | 5/2020 |
| WO | 2020259647 A1 | 12/2020 |
| WO | 2021009638 A1 | 1/2021 |
| WO | 2021102791 A1 | 6/2021 |

OTHER PUBLICATIONS

Office Action for corresponding Chinese application No. 202180016551.5 and its English translation, dated Jan. 30, 2023.
Notice of Allowance for related U.S. Appl. No. 17/610,223, dated Aug. 28, 2023.
Extended European Search Report for European Application No. EP-21922430.0, dated Aug. 7, 2023.
International Search Report and Written Opinion and English translation for International Application No. PCT/CN2021/073725, dated Nov. 3, 2021.
International Search Report and Written Opinion and English translation for International Application No. PCT/CN2021/094676, dated Feb. 9, 2022.
International Search Report and Written Opinion and English translation for International Application No. PCT/CN2021/128699, dated Dec. 23, 2021.
International Search Report and Written Opinion and English translation for International Application No. PCT/CN2021/128697, dated Jan. 27, 2022.
International Search Report and Written Opinion and English translation for International Application No. PCT/CN2021/128698, dated Jan. 28, 2022.

(56) References Cited

OTHER PUBLICATIONS

Extended European Search Report in EP Application No. 21940136.1, mailed Nov. 30, 2023.
Office Action cited in corresponding Chinese Application No. 202110726478.2, dated Nov. 28, 2024.
Office Action cited in corresponding Chinese Application No. 202110726472.5, dated Dec. 20, 2024.

DISPLAY PANEL AND DISPLAY DEVICE

CROSS-REFERENCE TO RELATED PATENT APPLICATIONS

This application is a Continuation of U.S. patent application Ser. No. 17/610,223, filed on Nov. 10, 2021, now U.S. Pat. No. 11,869,268 B2, which is a US. National Stage Application under 35 U.S.C. § 371 of International Patent Application No. PCT/CN2021/073725 filed Jan. 26, 2021, both of which are incorporated by reference in their entireties.

TECHNICAL FIELD

Embodiments of the present disclosure relate to a display panel and a display device.

BACKGROUND

With increasing popularity of mobile terminals, more and more users use mobile terminals to perform operations such as identity verification, electronic payment and so on. Because of the uniqueness of skin textures such as fingerprint patterns or palm print patterns, fingerprint recognition technology combined with optical imaging is gradually adopted by mobile electronic devices for identity verification, electronic payment, etc. How to design a more optimized texture recognition apparatus is a focus problem in the art.

SUMMARY

At least one embodiment of the present disclosure provides a display panel, the display panel has a texture touch surface on a surface of the display panel, and comprises a driving circuit layer, a light source array, an image sensor array, and a black matrix layer, the driving circuit layer comprises a pixel driving circuit; the light source array is on a side of the driving circuit layer close to the texture touch surface, and comprises a plurality of light sources, which are driven by the pixel driving circuit of the driving circuit layer during operation; the image sensor array is on a side of the driving circuit layer away from the texture touch surface, and comprises a plurality of image sensors, the plurality of image sensors are configured to receive light emitted from the plurality of light sources and reflected to the plurality of image sensors by a texture on a side of the texture touch surface away from the plurality of light sources, for texture collection; the black matrix layer is on a side of the light source array close to the texture touch surface, and comprises a plurality of first light-transmitting openings and a plurality of second light-transmitting openings, the plurality of first light-transmitting openings are configured to allow light, which is emitted from at least one of the plurality of light sources, emitted out from at least one of the plurality of second light-transmitting openings, and reflected by the texture, to pass through the plurality of first light-transmitting openings, to reach the plurality of image sensors. The driving circuit layer comprises a plurality of light-transmitting portions, and each of the plurality of first light-transmitting openings is arranged corresponding to at least one of the plurality of light-transmitting portions for transmitting light whose angle with the surface of the display panel is in a predetermined angle range, and in a first light-transmitting opening and a light-transmitting portion that are arranged correspondingly, a plane size of the first light-transmitting opening in a direction parallel to the surface of the display panel is smaller than a plane size of the light-transmitting portion in the direction parallel to the surface of the display panel.

For example, in the display panel provided by at least one embodiment of the present disclosure, in the first light-transmitting opening and the light-transmitting portion that are arranged correspondingly, an orthographic projection of the first light-transmitting opening in a direction perpendicular to the texture touch surface and an orthographic projection of the light-transmitting portion in the direction perpendicular to the texture touch surface at least partially overlaps with each other.

For example, in the display panel provided by at least one embodiment of the present disclosure, the pixel driving circuit comprises a plurality of circuit patterns, and the plurality of light-transmitting portions are respectively provided between adjacent circuit patterns.

For example, in the display panel provided by at least one embodiment of the present disclosure, the plurality of circuit patterns are respectively arranged in different layers. For example, in the display panel provided by at least one embodiment of the present disclosure, the driving circuit layer is filled with a light-transmitting material at the plurality of light-transmitting portions.

For example, in the display panel provided by at least one embodiment of the present disclosure, in a first direction perpendicular to the surface of the display panel, a distance from a surface of the black matrix layer away from the texture touch surface to the image sensor array is $H_1$, a distance from the surface of the black matrix layer away from the texture touch surface to the texture touch surface is $H_2$, and $3 \geq H_2/H_1 \geq 1$.

For example, in the display panel provided by at least one embodiment of the present disclosure, the driving circuit layer comprises a semiconductor layer, and a distance from a surface of the semiconductor layer away from the texture touch surface to the surface of the black matrix layer away from the texture touch surface is $H_3$, in a second direction parallel to the surface of the display panel, a size of a sensing region of an image sensor is $D_1$, and a size of a light-transmitting portion is $D_2$, and $D_2 \geq H_3 * H_1/D_1$.

For example, in the display panel provided by at least one embodiment of the present disclosure, in the second direction parallel to the surface of the display panel, a size of a first light-transmitting opening is $D_m$, and a distance from a surface of the driving circuit layer away from the texture touch surface to a surface of the black matrix layer close to the texture touch surface is $H_m$, and $D_m = H_m * D_1/H_1 - D_2$.

For example, the display panel provided by at least one embodiment of the present disclosure further comprises a pixel unit array, the pixel unit array comprises a plurality of pixel units, each of the plurality of pixel units comprises a plurality of sub-pixels, each of the plurality of sub-pixels comprises a light-emitting device, and the plurality of light sources comprise light-emitting devices of the plurality of sub-pixels.

For example, in the display panel provided by at least one embodiment of the present disclosure, the plurality of second light-transmitting openings of the black matrix layer are a plurality of sub-pixel openings, the plurality of sub-pixel openings are arranged in one-to-one correspondence with the plurality of sub-pixels, so as to respectively transmit light emitted by the plurality of sub-pixels.

For example, the display panel provided by at least one embodiment of the present disclosure further comprises a plurality of color filters respectively arranged in the plurality of sub-pixel openings.

For example, in the display panel provided by at least one embodiment of the present disclosure, the plurality of first light-transmitting openings are arranged in one-to-one correspondence with the plurality of pixel units, or each of the plurality of first light-transmitting openings is provided corresponding to a plurality of pixel units.

For example, in the display panel provided by at least one embodiment of the present disclosure, in a first light-transmitting opening and a pixel unit that are arranged correspondingly, the first light-transmitting opening and light-emitting layers of light-emitting devices of sub-pixels in the pixel unit do not overlap in a direction perpendicular to the texture touch surface.

For example, in the display panel provided by at least one embodiment of the present disclosure, in the first light-transmitting opening and the pixel unit that are arranged correspondingly, a line connecting centers of light-emitting layers of two adjacent sub-pixels in the pixel unit and a center of the first light-transmitting opening do not overlap in the direction perpendicular to the texture touch surface.

For example, in the display panel provided by at least one embodiment of the present disclosure, each of the plurality of image sensors comprises a filter component, and the filter component is configured to filter out light with a wavelength greater than 620 nanometers.

For example, in the display panel provided by at least one embodiment of the present disclosure, the plurality of sub-pixels comprised in each pixel unit comprise a red sub-pixel, a green sub-pixel, and a blue sub-pixel, the red sub-pixel comprises a first light-emitting device, and the first light-emitting device comprises a first electrode, a second electrode, and a red light-emitting layer between the first electrode and the second electrode, the green sub-pixel comprises a second light-emitting device, and the second light-emitting device comprises a third electrode, a fourth electrode, and a green light-emitting layer between the third electrode and the fourth electrode, the blue sub-pixel comprises a third light-emitting device, and the third light-emitting device comprises a fifth electrode, a sixth electrode, and a blue light-emitting layer between the fifth electrode and the sixth electrode, in a first light-transmitting opening and a pixel unit that are arranged correspondingly, a distance from the first light-transmitting opening to the red light-emitting layer is smaller than a distance from the first light-transmitting opening to the green light-emitting layer and a distance from the first light-transmitting opening to the blue light-emitting layer.

For example, the display panel provided by at least one embodiment of the present disclosure further comprises a controller, the controller is configured to light up red sub-pixels in the plurality of pixel units to serve as photosensitive light sources of the plurality of image sensors during a process of texture recognition.

For example, in the display panel provided by at least one embodiment of the present disclosure, in a first direction perpendicular to the surface of the display panel, a distance from a surface of the black matrix layer away from the texture touch surface to the image sensor array is $H_1$, the driving circuit layer comprises a semiconductor layer, and a distance from a surface of the semiconductor layer away from the texture touch surface to the surface of the black matrix layer away from the texture touch surface is $H_3$, a distance from the surface of the black matrix layer away from the texture touch surface to a surface of the green light-emitting layer or the blue light-emitting layer close to the texture touch surface is $H_4$, in a second direction parallel to the surface of the display panel, a size of a sensing region of an image sensor is $D_1$, and a distance from the light-transmitting portion to the green light-emitting layer or the blue light-emitting layer is L, and $L \geq (H_3-H_4)*D_1/(2*H_1)$.

For example, in the display panel provided by at least one embodiment of the present disclosure, $L \geq (2*H_4+H_3)*D_1/(2*H_1)$.

For example, the display panel provided by at least one embodiment of the present disclosure further comprises a touch control layer on a side of the black matrix layer away from or close to the light source array, in a first direction perpendicular to the surface of the display panel, portions of the touch control layer overlapping with the plurality of first light-transmitting openings are light-transmissive.

For example, the display panel provided by at least one embodiment of the present disclosure further comprises a touch control layer on a side of the black matrix layer away from or close to the light source array, the touch control layer comprises an opaque material, an orthographic projection of the opaque material in a direction perpendicular to the texture touch surface does not overlap with orthographic projections of the plurality of first light-transmitting openings and the plurality of light-transmitting portions in the direction perpendicular to the texture touch surface.

For example, in the display panel provided by at least one embodiment of the present disclosure, the plurality of first light-transmitting openings are arranged in an array, and in a same direction, a distance between any two adjacent first light-transmitting openings is identical.

For example, in the display panel provided by at least one embodiment of the present disclosure, a plane shape of each of the plurality of first light-transmitting openings is a circle or a convex polygon.

At least one embodiment of the present disclosure further provides a display device, the display device comprises any display panel provided by the embodiments of the present disclosure.

BRIEF DESCRIPTION OF THE DRAWINGS

In order to clearly illustrate technical solutions of the embodiments of the present disclosure, the drawings of the embodiments will be briefly described in the following; it is obvious that the described drawings are only related to some embodiments of the disclosure and thus are not limitative of the disclosure.

DETAILED DESCRIPTION

Figure 1:
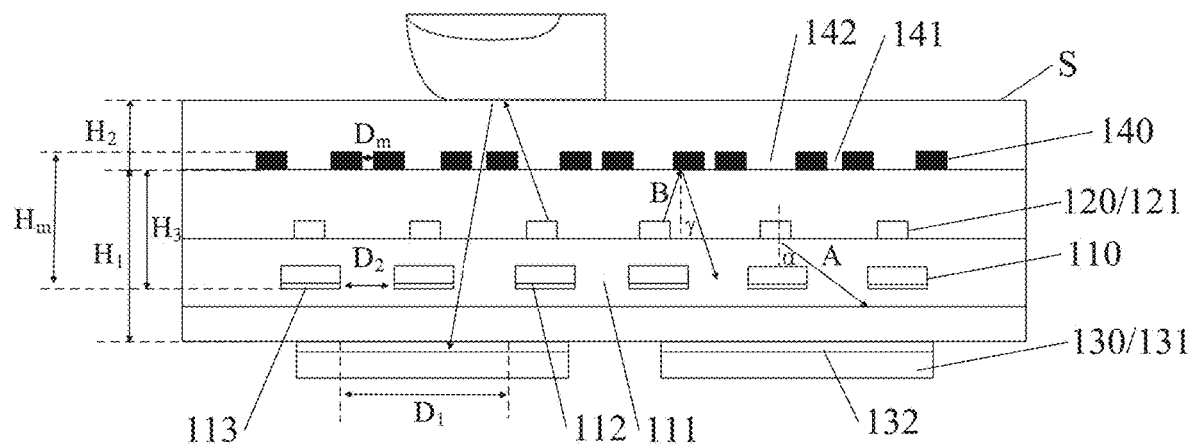
FIG. 1 is a schematic cross-sectional view of a display panel provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

A display panel with a texture collection function usually includes a light source and an image sensor that can be used for texture collection. The light emitted by the light source is reflected by the texture and reaches the image sensor, so that the image sensor can use the reflected light to achieve texture collection. The inventors of the present disclosure found in research that in the process of performing texture collection by the display panel, due to the complexity of the structure of the display panel, the light emitted from the light source and reflected by the texture to the image sensor is weak, and external stray light may also be incident on the image sensor, which may cause that the display panel cannot achieve the texture collection well, thereby affecting the speed and accuracy of texture recognition.

At least one embodiment of the present disclosure provides a display panel, the display panel has a texture touch surface on a surface of the display panel, and the display panel includes a driving circuit layer, a light source array, an image sensor array, and a black matrix layer. The driving circuit layer includes a pixel driving circuit; the light source array is on a side of the driving circuit layer close to the texture touch surface, and includes a plurality of light sources, which are driven by the pixel driving circuit of the driving circuit layer during operation; the image sensor array is on a side of the driving circuit layer away from the texture touch surface and includes a plurality of image sensors, the plurality of image sensors are configured to receive light emitted from the plurality of light sources and reflected to the plurality of image sensors by a texture on a side of the texture touch surface away from the plurality of light sources, for texture collection; and the black matrix layer is on a side of the light source array close to the texture touch surface and includes a plurality of first light-transmitting openings and a plurality of second light-transmitting openings, the plurality of first light-transmitting openings are configured to allow light, which is emitted from at least one of the plurality of light sources, emitted out from at least one of the plurality of second light-transmitting openings, and reflected by the texture, to pass through the plurality of first light-transmitting openings, to reach the plurality of image sensors. The driving circuit layer includes a plurality of light-transmitting portions, and each of the plurality of first light-transmitting openings is arranged corresponding to at least one of the plurality of light-transmitting portions for transmitting light whose angle with the surface of the display panel is in a predetermined angle range, and in a first light-transmitting opening and a light-transmitting portion that are arranged correspondingly, a plane size of the first light-transmitting opening in a direction parallel to the surface of the display panel is smaller than a plane size of the light-transmitting portion in the direction parallel to the surface of the display panel.

The black matrix layer of the display panel can block external stray light, and the black matrix layer has light-transmitting openings that can transmit the light that is reflected by the texture and is used for texture collection, correspondingly, the driving circuit layer also has a light-transmitting portion that can transmit the light that is reflected by the texture and is used for the texture collection, thereby forming a path for the light used for texture collection, so that the light used for texture collection can fully reach the plurality of image sensors through this path, thereby meeting the texture collection requirements of the plurality of image sensors and improving the texture collection efficiency and texture recognition accuracy of the display panel.

Hereinafter, some embodiments of the present disclosure will be described in detail with reference to the accompanying drawings. It should be noted that the same reference numeral in different drawings will be used to refer to the same component that has been described.

At least one embodiment of the present disclosure provides a display panel, as shown in FIG. 1, the display panel has a texture touch surface S on a surface of the display panel, and the user can touch the texture touch surface S to achieve a touch control operation of the display panel, a texture recognition function, and the like.

As shown in FIG. 1, the display panel includes structures such as a driving circuit layer 110, a light source array 120, an image sensor array 130, and a black matrix layer 140.

For example, the driving circuit layer 110 includes a pixel driving circuit. The light source array 120 is disposed on a side of the driving circuit layer 110 close to the texture touch surface S, and includes a plurality of light sources 121, and the plurality of light sources 121 can provide light for texture recognition. For example, the plurality of light sources 121 are arranged in an array in a predetermined region, and are driven by the pixel driving circuit of the driving circuit layer 110 during operation. For example, the pixel driving circuit of the driving circuit layer 110 includes a plurality of sub-pixel driving circuits, and the plurality of sub-pixel driving circuits are respectively used to drive the plurality of light sources 121.

For example, the image sensor array 130 is disposed on a side of the driving circuit layer 110 away from the texture touch surface S, and includes a plurality of image sensors 131, for example, the plurality of image sensors 131 are arranged in an array in a predetermined region, and are configured to receive light, which is emitted from the light sources 121 and reflected to the plurality of image sensors 131 by a texture (for example, a texture of a finger or a palm) on a side of the texture touch surface S away from the light sources 121, for texture collection. Therefore, the light reflected to the image sensor 131 is the light reflected by an operating body, such as a finger or a palm of the operating body, with textures; the plurality of image sensors 131 synthesize the required texture pattern according to the respective electrical signals generated by the light.

For example, the black matrix layer 140 is disposed on a side of the light source array 120 close to the texture touch surface S, and includes a plurality of first light-transmitting openings 141 and a plurality of second light-transmitting openings 142, the plurality of first light-transmitting openings 141 are configured to allow light, which is emitted from at least one of the plurality of light sources 121, emitted out from at least one of the plurality of second light-transmitting openings 142, and reflected by the texture, to pass through the plurality of first light-transmitting openings 141, to reach the plurality of image sensors 131, that is, the plurality of first light-transmitting openings 141 are configured such that the light emitted by at least part of the light sources 121 can reach the texture through at least part of the second light-transmitting openings 142 and be reflected by the texture, and the light reflected by the texture can reach the plurality of image sensors 131 through the plurality of first light-transmitting openings 141, so that the plurality of image sensors 131 can perform texture collection based on the part of the light.

For example, the driving circuit layer 110 includes a plurality of light-transmitting portions 111, and each of the plurality of first light-transmitting openings 111 is arranged corresponding to at least one of the plurality of light-transmitting portions 111 for transmitting light whose angle with the surface of the display panel is in a predetermined angle range. For example, a beam of light whose angle with the surface of the display panel is in the predetermined angle range can sequentially pass through the first light-transmitting opening 141 and the light-transmitting portion 111 that are arranged correspondingly to reach the image sensor 131. For example, in a first light-transmitting opening 141 and a light-transmitting portion 111 that are arranged correspondingly, a plane size of the first light-transmitting opening 141 in a direction parallel to the surface of the display panel (for example, a horizontal direction in the figure) is smaller than a plane size of the light-transmitting portion 111 in the direction parallel to the surface of the display panel.

It should be noted that, in the embodiments of the present disclosure, the "plane size" of a structure may refer to an area occupied by the structure on a plane or a length along a certain direction. For example, in some embodiments, in a case where the first light-transmitting opening 141 and the light-transmitting portion 111 are substantially in a rectangular shape, a length of the first light-transmitting opening 141 is less than a length of the light-transmitting portion 111, and a width of the first light-transmitting opening 141 is less than or equal to a width of the light-transmitting portion 111; or, in a case where the first light-transmitting opening 141 and the light-transmitting portion 111 are substantially in a circular shape, a diameter of the first light-transmitting opening 141 is smaller than a diameter of the light-transmitting portion 111.

For example, in some embodiments, in the first light-transmitting opening 141 and the light-transmitting portion 111 that are arranged correspondingly, an orthographic projection of the first light-transmitting opening 141 in a direction perpendicular to the texture touch surface S (that is, a vertical direction in the figure) and an orthographic projection of the light-transmitting portion 111 in the direction perpendicular to the texture touch surface S at least partially overlap with each other.

For example, in some examples, the orthographic projection of the first light-transmitting opening 141 in the direction perpendicular to the texture touch surface S may be located in the orthographic projection of the light-transmitting portion 111 in the direction perpendicular to the texture touch surface S.

In addition, in the embodiments of the present disclosure, the operating body with textures may be a hand, and the texture recognized by the image sensor 131 in this case is a skin texture, such as a fingerprint, a palm print, etc.; in other embodiments, the operating body with textures may also be a non-biological body with a certain texture, such as an object, which is made of resin and other materials, with a certain texture. The embodiments of the present disclosure do not specifically limit this.

For example, in some embodiments, the pixel driving circuit 110 includes a plurality of circuit patterns 112, and the plurality of light-transmitting portions 111 are respectively disposed between adjacent circuit patterns 112. For example, the plurality of circuit patterns 112 may be a plurality of sub-pixel driving circuits in the pixel driving circuit 110, which will be described in detail later.

For example, in some embodiments, the plurality of circuit patterns 112 are respectively arranged in different layers; that is, the plurality of circuit patterns 112 respectively include a plurality of portions arranged in different layer structures of the display panel, and these portions collectively constitute the circuit patterns 112.

For example, in some embodiments, the driving circuit layer 110 is filled with a light-transmitting material at the plurality of light-transmitting portions 111, for example, is filled with a light-transmitting insulating material, so as to achieve electrical insulation. The light-transmitting insulating material may be a light-transmitting inorganic material or organic material, such as silicon oxide, silicon nitride, silicon oxynitride, resin material, or the like.

Figure 2:
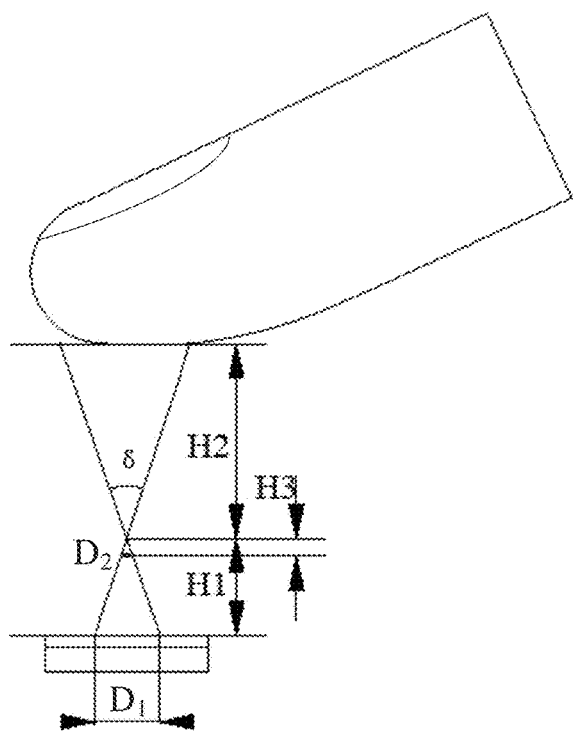
FIG. 2 is a simplified diagram of each size in a display panel provided by at least one embodiment of the present disclosure.

For example, in some embodiments, as shown in FIG. 1, in a first direction (that is, the vertical direction in the figure) perpendicular to the surface of the display panel, a distance from a surface (that is, a lower surface) of the black matrix layer 140 away from the texture touch surface S to the image sensor array is $H_1$, a distance from the surface of the black matrix layer 140 away from the texture touch surface S to the texture touch surface S is $H_2$, FIG. 2 is a simplified diagram for showing these sizes, for example, $3 \geq H_2/H_1 \geq 1$, for example, $H_2/H_1 = 2$, and so on. Under these sizes, the black matrix layer 140 can fully achieve the function of shielding ambient light, and the light path formed by the first light-transmitting opening 141 of the black matrix layer 140 can fully transmit the signal light used for texture recognition. If the above value of $H_2/H_1$ is too large, it may cause external stray light to enter the image sensor 131. If the above value of $H_2/H_1$ is too small, it may result that the intensity of the signal light passing through the first light-transmitting opening 141 may be not enough to collect a clear and accurate texture image.

For example, in some embodiments, as shown in FIG. 1, the driving circuit layer 110 comprises a semiconductor layer 113, a distance from a surface (that is, a lower surface) of the semiconductor layer 113 away from the texture touch surface S to the surface of the black matrix layer away from the texture touch surface is $H_3$, in a second direction (for example, the horizontal direction in the figure) parallel to the surface of the display panel, a size of a sensing region of the image sensor is $D_1$, and a size of a light-transmitting portion 111 (for example, the size of the light-transmitting portion formed on the surface of the driving circuit layer 110 away from the texture touch surface S in FIG. 1) is $D_2$, combined with FIG. 2, according to the principle of similarity between the object distance triangle and the image distance triangle, it can be calculated that when $D_2 \geq H_3 * H_1 / D_1$, the light-transmitting portion 111 can ensure to transmit enough signal light.

It should be noted that, in the embodiments of the present disclosure, there are a plurality of second directions parallel to the surface of the display panel, the size of each structure mentioned in the embodiments of the present disclosure is the size in a specific second direction, that is, in the same second direction, each of the above-mentioned structures has the above-mentioned size and the sizes of the above-mentioned structures satisfy the above-mentioned relationship.

For example, as shown in FIG. 2, the effective receiving field angle of signal collection is $\delta$, and $\delta = 2 \arctan(2*H_1/D_1)$. In order to ensure the incident angle of the signal light on the texture touch surface S and the collection intensity of the signal light, the effective receiving field angle of signal collection $\delta$ is at most 90°, in this case, $2*H_1 = D_1$.

For example, in some embodiments, as shown in FIG. 1, in the second direction parallel to the surface of the display panel, a size of the first light-transmitting opening 141 is $D_m$, and a distance from a surface of the driving circuit layer 110 away from the texture touch surface S to a surface of the black matrix layer 140 close to the texture touch surface S is $H_m$, and $H_1/D_1 = H_m/(D_m + D_2)$, and thus it can be obtained that $D_m = H_m * D_1/H_1 - D_2$. That is, when the size $D_m$ of the first light-transmitting opening 141 satisfies the above formula, it can be ensured that light whose angle with the surface of the display panel is in the predetermined angle range can sequentially pass through the first light-transmitting opening 141 and the light-transmitting portion 111 to reach the image sensor, that is, the light path formed by the first light-transmitting opening 141 and the light-transmitting portion 111 can sufficiently transmit the signal light used for texture collection.

For example, in some embodiments, the black matrix layer 140 may be formed of an opaque material, such as an opaque material with a transmittance of less than 0.001%. The opaque material is formed by adding black doping impurity to an organic resin material, for example.

Figure 3:
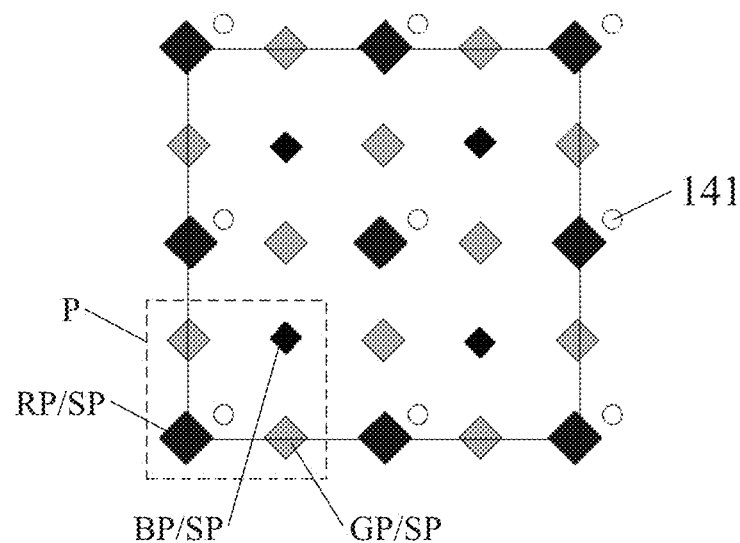
FIG. 3 is a schematic diagram of a pixel unit array of a display panel provided by at least one embodiment of the present disclosure.

For example, in some embodiments, the display panel further includes a pixel unit array, and the pixel unit array is used to display an image. For example, FIG. 3 shows a schematic diagram of an arrangement of a pixel unit array in a display panel. As shown in FIG. 3, the pixel unit array includes a plurality of pixel units P, each of the plurality of pixel units P includes a plurality of sub-pixels SP, and each of the plurality of sub-pixels SP includes a light-emitting device. For example, the plurality of light sources 121 include light-emitting devices of the plurality of sub-pixels SP. Thus, the light-emitting devices of the plurality of sub-pixels SP are further used as the light sources 121 for texture recognition, that is, the plurality of sub-pixels SP are simultaneously used for display of the display panel and texture collection, thereby simplifying the structure of the display panel.

For example, in some embodiments, the plurality of second light-transmitting openings 142 of the black matrix layer 140 are a plurality of sub-pixel openings, the plurality of sub-pixel openings are arranged in one-to-one correspondence with the plurality of sub-pixels SP, so as to respectively transmit light emitted by the plurality of sub-pixels SP, and therefore, when the plurality of sub-pixels SP are used for display, the light emitted by the plurality of sub-pixels SP can pass through the plurality of sub-pixel openings to form a display image; and when the plurality of sub-pixels SP are used for texture collection, the light emitted by the plurality of sub-pixels SP may pass through the plurality of sub-pixel openings and then be reflected by the texture on the texture touch surface S to the image sensor 131 for texture collection.

Figure 4:
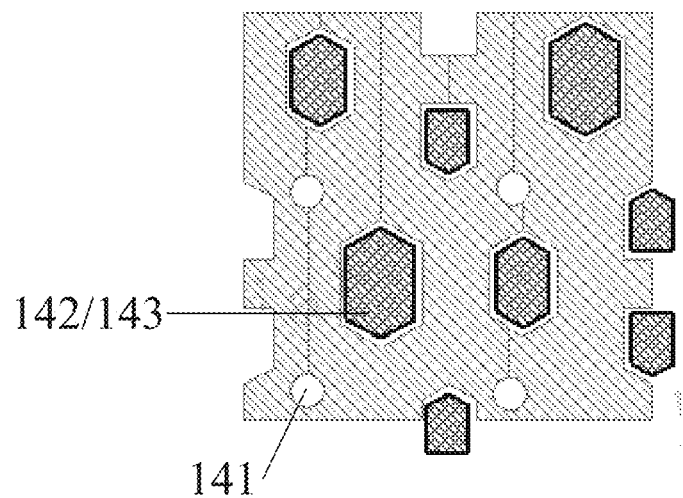
FIG. 4 is a schematic diagram of a black matrix layer of a display panel provided by at least one embodiment of the present disclosure.

For example, FIG. 4 shows a schematic diagram of a black matrix layer 140. As shown in FIG. 1 and FIG. 4, in some embodiments, the display panel further includes a plurality of color filters 143 respectively arranged in the plurality of sub-pixel openings. The plurality of color filters 143 can respectively transmit the light emitted by the plurality of sub-pixels SP to form monochromatic light. For example, when the light emitted by the plurality of sub-pixels SP is white light, the white light may pass through the plurality of color filters 143 to form a variety of monochromatic light; or, when the light emitted by the plurality of sub-pixels SP is monochromatic light of different colors, the color of the light that the color filter 143 can transmit corresponds to the color of the light emitted by the corresponding sub-pixel SP, so that the color of the emitted monochromatic light is purer.

For example, in some embodiments, the plurality of first light-transmitting openings 141 are arranged in one-to-one correspondence with the plurality of pixel units, as shown in FIG. 3. Alternatively, in other embodiments, each of the plurality of first light-transmitting openings is provided corresponding to a plurality of pixel units, in this case, each of the plurality of first light-transmitting openings overlaps with one of the plurality of pixel units provided corresponding to the each of the plurality of first light-transmitting openings in a direction perpendicular to the texture touch surface S. The embodiments of the present disclosure do not specifically limit the corresponding relationship between the plurality of first light-transmitting openings and the plurality of pixel units.

For example, in some embodiments, in the first light-transmitting opening 141 and the pixel unit P that are arranged correspondingly (or overlapped), the first light-transmitting opening 141 and light-emitting layers of light-emitting devices of sub-pixels SP in the pixel unit P do not overlap in a direction perpendicular to the texture touch surface, that is, the first light-transmitting opening 141 is provided between light-emitting layers of light-emitting devices of adjacent sub-pixels SP in the pixel unit P, in other words, the first light-transmitting opening 141 is provided between light-emitting regions of adjacent sub-pixels SP in the pixel unit P.

For example, in some embodiments, in the first light-transmitting opening 141 and the pixel unit P that are arranged correspondingly, a line connecting centers of light-emitting layers of two adjacent sub-pixels SP in the pixel unit P and a center of the first light-transmitting opening 141 do not overlap in the direction perpendicular to the texture touch surface S.

It should be noted that, in the embodiments of the present disclosure, the "center" of a structure may refer to the geometric center of the shape of the structure in the plane parallel to the texture touch surface S.

For example, in some embodiments, as shown in FIG. 1, each of the plurality of image sensors 131 includes a filter component 132, and the filter component 132 is configured to filter out light with a wavelength greater than 620 nanometers. Because a normal human body emits infrared light, in order to reduce the influence of the infrared light on texture imaging, by adding the filter component 132 in the image sensor 131, infrared light with a wavelength greater than 620 nanometers can be removed, thereby preventing the light emitted by the human body from affecting the texture collection.

Figure 5A:
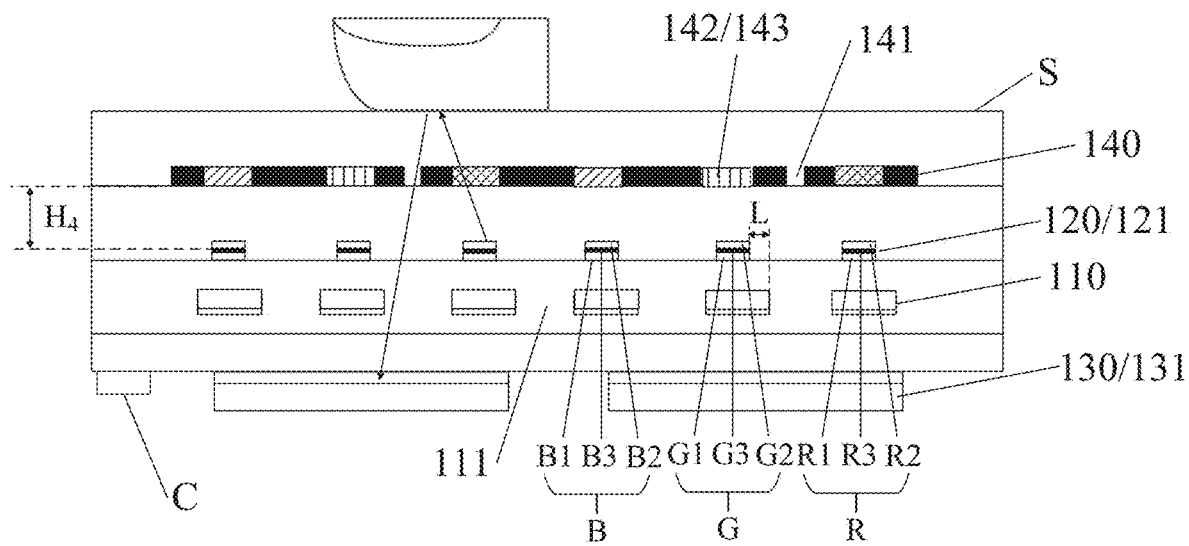
FIG. 5A is another schematic cross-sectional view of a display panel provided by at least one embodiment of the present disclosure.

For example, in some embodiments, as shown in FIG. 3, the plurality of sub-pixels in each pixel unit P include a red sub-pixel RP, a green sub-pixel GP, and a blue sub-pixel BP. For example, as shown in FIG. 5A, the red sub-pixel RP includes a first light-emitting device R, and the first light-emitting device R includes a first electrode R1, a second electrode R2, and a red light-emitting layer R3 between the first electrode R1 and the second electrode R2, the green sub-pixel GP includes a second light-emitting device G, and the second light-emitting device G includes a third electrode G1, a fourth electrode G2, and a green light-emitting layer G3 between the third electrode G1 and the fourth electrode G2, the blue sub-pixel BP includes a third light-emitting device B, and the third light-emitting device B includes a fifth electrode B1, a sixth electrode B2, and a blue light-emitting layer B3 between the fifth electrode B1 and the sixth electrode B2. For example, the shape of each sub-pixel SP shown in FIG. 3 is the shape of the corresponding light-emitting layer. For example, in some embodiments, in the first light-transmitting opening 141 and the pixel unit that are arranged correspondingly, a distance from the first light-transmitting opening 141 to the red light-emitting layer R3 is smaller than a distance from the first light-transmitting opening 141 to the green light-emitting layer G3 and is smaller than a distance from the first light-transmitting opening 141 to the blue light-emitting layer B3.

Figure 5B:
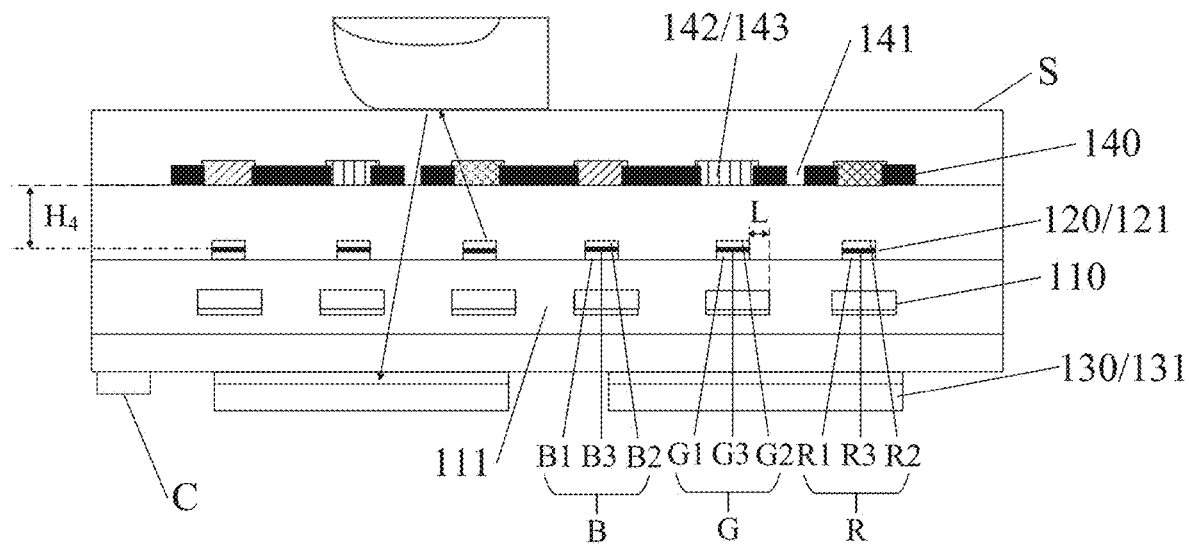
FIG. 5B is still another schematic cross-sectional view of a display panel provided by at least one embodiment of the present disclosure.

For example, in some instances, as shown in FIG. 5A, the plurality of color filters 143 may be respectively filled in the second light-transmitting openings 142 of the black matrix layer 140 and may be flush with the surface of the black matrix layer 140; in other embodiments, as shown in FIG. 5B, the height of the color filter 143 is greater than the height of the black matrix layer 140, and the edge of the color filter 143 covers the edge of the black matrix layer 140 close to the second light-transmitting opening 142, so that the color filter 143 fully fill the second light-transmitting opening 142.

Figure 6:
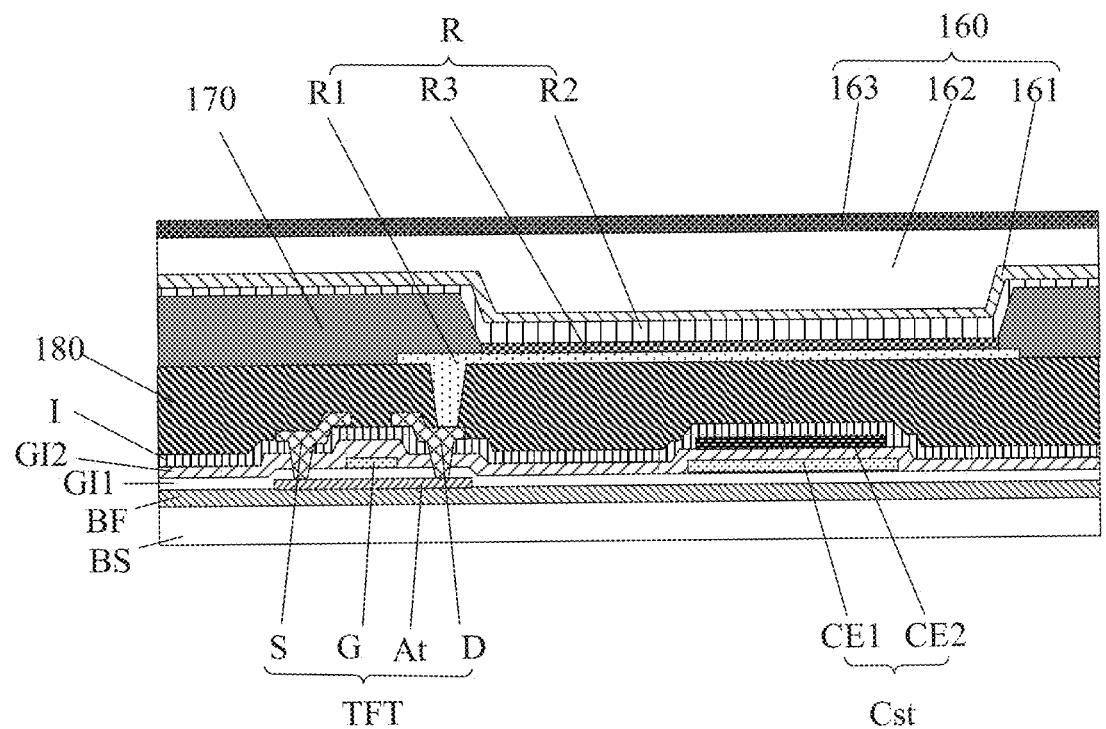
FIG. 6 is a schematic cross-sectional view of a sub-pixel of a display panel provided by at least one embodiment of the present disclosure.

For example, FIG. 6 shows a schematic structural diagram of one sub-pixel (for example, a red sub-pixel) of the display panel. As shown in FIG. 6, the sub-pixel includes a sub-pixel driving circuit in the driving circuit layer 110 for driving the first light-emitting device R, and the sub-pixel driving circuit includes a thin film transistor TFT and a storage capacitor Cst. The thin film transistor TFT includes an active layer At, a gate electrode G, a source electrode S, and a drain electrode D. For example, a layer where the active layer At is located is the semiconductor layer 113 of the above-mentioned driving circuit layer 110, and a surface of the active layer At away from the texture touch surface S is the surface of the driving circuit layer 110 away from the texture touch surface S. The drain electrode D of the thin film transistor TFT is electrically connected to the first electrode R1 of the first light-emitting device R for driving the first light-emitting device R. For example, the storage capacitor Cst includes a first capacitor electrode CE1 and a second capacitor electrode CE2, the first capacitor electrode CE1 and the gate electrode are arranged in the same layer, that is, the first capacitor electrode CE1 and the gate electrode can be formed by using the same material layer through the same process during the manufacturing process. For example, the sub-pixel driving circuit is implemented as the circuit pattern in the driving circuit layer 110 described above.

In addition, as shown in FIG. 6, the display panel may further include a base substrate BS, a buffer layer BF disposed on the base substrate BS, a first gate insulating layer GI1 disposed on the active layer At, a second gate insulating layer GI2 disposed on the gate electrode G and the first capacitor electrode CE1, an interlayer insulating layer I disposed on the second capacitor electrode CE2, a planarization layer 180 disposed on the source electrode S and the drain electrode D, a pixel defining layer 170 disposed between the light-emitting devices of the sub-pixels, and an encapsulation layer 160 disposed on the light-emitting devices of the sub-pixels, and other structures. For example, the encapsulation layer 180 may include a plurality of sub-encapsulation layers to improve the encapsulation effect of the encapsulation layer 180. For example, the encapsulation layer 180 may include a first inorganic encapsulation layer 161, a second organic encapsulation layer 162, and a third inorganic encapsulation layer 163. For example, the light-transmitting material filled at the plurality of light-transmitting portions 111 includes the light-transmitting insulating materials of the insulating layers such as the first gate insulating layer GI1, the second gate insulating layer GI2, and the interlayer insulating layer I.

For example, the image sensor 131 may be disposed on a side of the base substrate BS close to the buffer layer BF or a side of the base substrate BS away from the buffer layer BF. For example, in a case where the image sensor 131 is disposed on the side of the base substrate BS away from the buffer layer BF, the image sensor 131 may be directly attached to the base substrate BS after the display panel is manufactured, so as not to affect the manufacturing process of the display panel.

For example, in some embodiments, as shown in FIG. 1, the display panel further comprises a controller C, the controller C is configured to light up red sub-pixels in the plurality of pixel units P to serve as photosensitive light sources of the plurality of image sensors 131 during a process of texture recognition. Thus, because the distance from the first light-transmitting opening 141 to the red light-emitting layer R3 is smaller than the distance from the first light-transmitting opening 141 to the green light-emitting layer G3 and the distance from the first light-transmitting opening 141 to the blue light-emitting layer B3, and the filter components 132 in the plurality of image sensors 131 can filter out light with a wavelength greater than 620 nanometers, the display panel can use the red light emitted by the red sub-pixels RP as the signal light to more accurately collect the texture image.

For example, in some cases, during the process of texture collection, the light emitted by the light source 121 (or sub-pixel) may directly enter the image sensor 131 downward, as shown in FIG. 1, part of the light A emitted by the light source 121 (or sub-pixel) can directly enter the image sensor 131 through the light-transmitting portion 111, and this part of the light will affect the texture collection and is called first-level stray light. In addition, the light B emitted by the light source 121 (or sub-pixel) is reflected by the black matrix layer 140 and enters the image sensor 131 through the light-transmitting portion 111, this part of the light may also affect the texture collection and is called second-level stray light. In some cases, some light emitted by the light source 121 (or sub-pixel) may also enter the image sensor 131 after being reflected a plurality of times in the display panel, thereby forming multi-level stray light. Because the intensity of the multi-level stray light is relatively weaker than the intensity of the first-level stray light and the intensity of the second-level stray light, thereby focusing on analyzing the first-level stray light and the second-level stray light, and through the structure design of the display panel, trying to avoid the first-level stray light and the second-level stray light from affecting the texture collection of the display panel.

For example, in some embodiments, as shown in FIG. 5A, in a first direction perpendicular to the surface of the display panel, a distance from the surface of the black matrix layer 140 away from the texture touch surface S to a surface (that is, an upper surface) of the green light-emitting layer G3 or the blue light-emitting layer B3 close to the texture touch surface S is $H_4$, in a second direction parallel to the surface of the display panel, a distance from the light-transmitting portion 111 to the green light-emitting layer or the blue light-emitting layer is L, as shown in FIG. 1, the angle between the first-level stray light and the direction perpendicular to the surface of the display panel (the vertical direction in the figure) is set as $\alpha$, in order to meet the requirement of the effective receiving field angle of signal collection, $L/(H_3-H_4) \geq \tan \alpha$, for example, $\alpha$ is 45 degrees, and $L \geq (H_3-H_4)$. On the other hand, in order to satisfy that the first light-transmitting opening 141 and the light-transmitting portion 111 form an optical path, $L/(H_3-H_4) \geq 2*H_1/D_1$, thus obtaining $L \geq (H_3-H_4)*D_1/(2*H_1)$. Combined the above two aspects, considering the first-level stray light, the value of the distance L from the light-transmitting portion 111 to the green light-emitting layer or the blue light-emitting layer is finally obtained, that is, $L \geq (H_3-H_4)*D_1/(2*H_1)$.

In addition, as shown in FIG. 1, the angle between the second-level stray light and the direction perpendicular to the surface of the display panel (the vertical direction in the figure) is set as $\gamma$, in order to meet the requirement of the effective receiving field angle of signal collection, $L/(2H_4+H_3) \geq \tan \gamma$, for example, $\gamma$ is 45 degrees, and $L \geq H_3+2H_4$. On the other hand, in order to satisfy that the first light-transmitting opening 141 and the light-transmitting portion 111 form an optical path, then $L/(2H_4+H_3) \geq 2*H_1/D_1$, thus obtaining $L \geq (2H_4+H_3)*D_1/(2*H_1)$. Combined the above two aspects, considering the second-level stray light, the value of the distance L from the light-transmitting portion 111 to the green light-emitting layer or the blue light-emitting layer is finally obtained, that is, $L \geq (2H_4+H_3)*D_1/(2*H_1)$.

For example, if the influence of N-level stray light is considered, then $L \geq (2(\Sigma_4^n Hn)+H_3)*D_1/(2*H_1)$, where Hn represents the distance that light travels after being reflected a plurality of times.

Through the above parameter design, it can be further ensured that enough signal light can fully pass through the transmitting path for signal light, which is formed by the first light-transmitting opening 141 and the light-transmitting portion 111, and the influence of stray light can be avoided, thereby improving the accuracy of the texture collection of the display panel.

Figure 7:
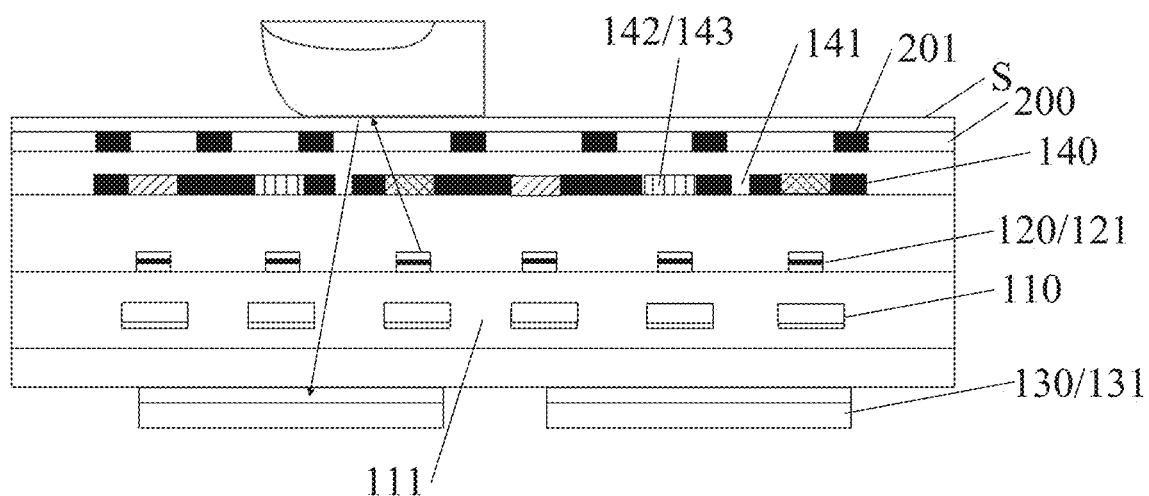
FIG. 7 is yet another schematic cross-sectional view of a display panel provided by at least one embodiment of the present disclosure.

For example, in some embodiments, as shown in FIG. 7, the display panel further includes a touch control layer 200 on a side of the black matrix layer 140 away from the light source array 120, in the first direction (the vertical direction in the figure) perpendicular to the surface of the display panel, the portions of the touch control layer 200 overlapping with the plurality of first light-transmitting openings 141 are light-transmissive, so as to avoid the touch control layer 200 from affecting the transmission of the signal light.

For example, the touch control layer 200 includes an opaque material. An orthographic projection of the opaque material in a direction perpendicular to the texture touch surface S does not overlap with orthographic projections of the plurality of first light-transmitting openings 141 and the plurality of light-transmitting portions 111 in the direction perpendicular to the texture touch surface S.

For example, the touch control layer 200 includes circuit patterns 201 such as touch electrodes and touch traces for achieving a touch function, and these circuit patterns 201 are formed of opaque materials, for example, are formed as a metal mesh structure, in this case, these circuit patterns 201 are designed to not overlap with the plurality of first light-transmitting openings 141 and the plurality of light-transmitting portions 111 in the first direction (the vertical direction in the figure) perpendicular to the surface of the display panel, so as to prevent the touch control layer 200 from affecting the transmission of the signal light.

Figure 8:
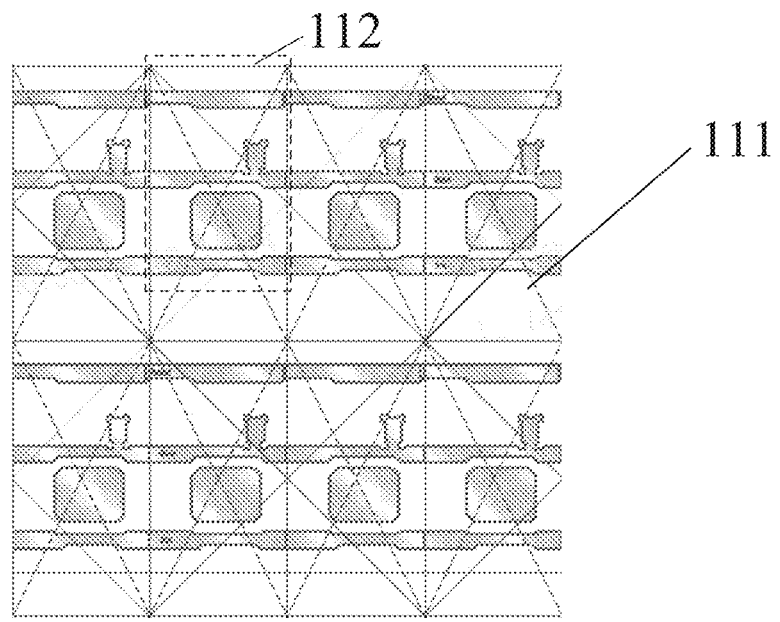
FIGS. 8-12 are diagrams of layer structures of a display panel provided by at least one embodiment of the present disclosure.
Figure 9:
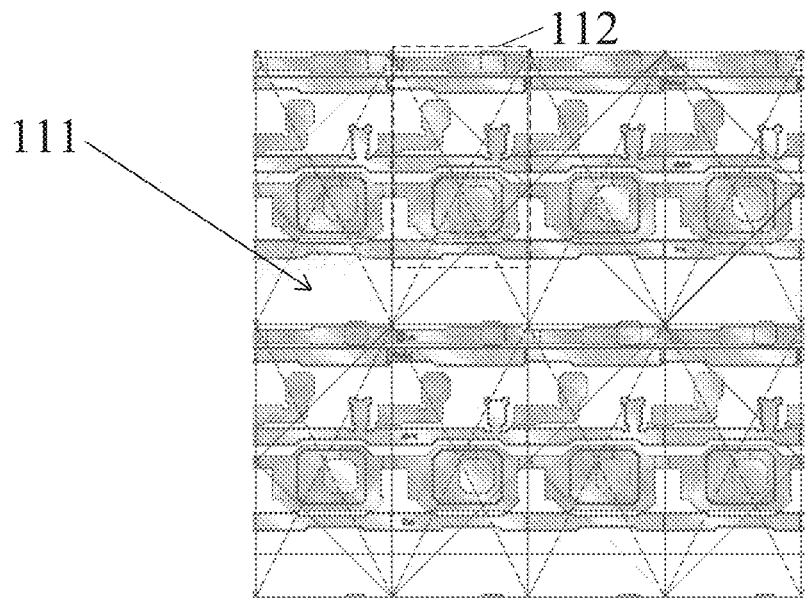
Figure 10:
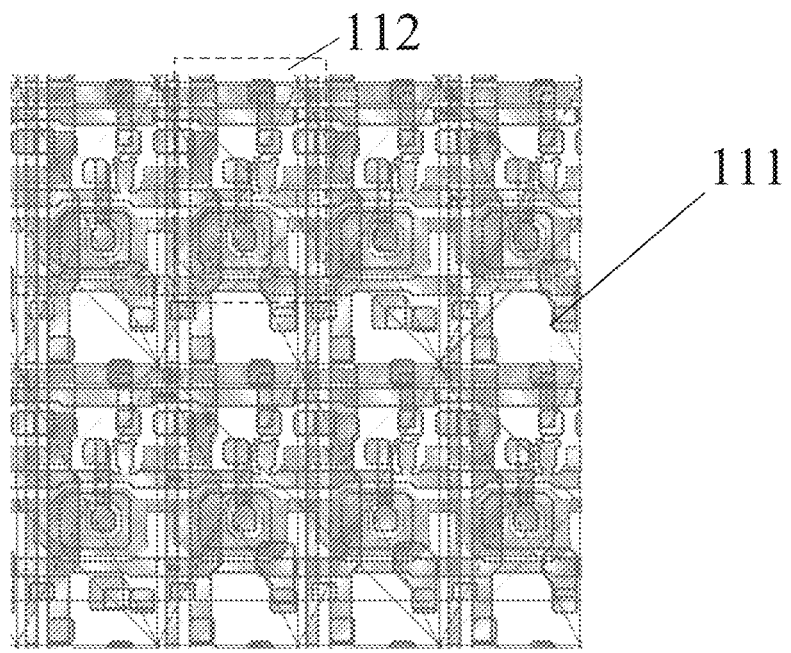
Figure 11:
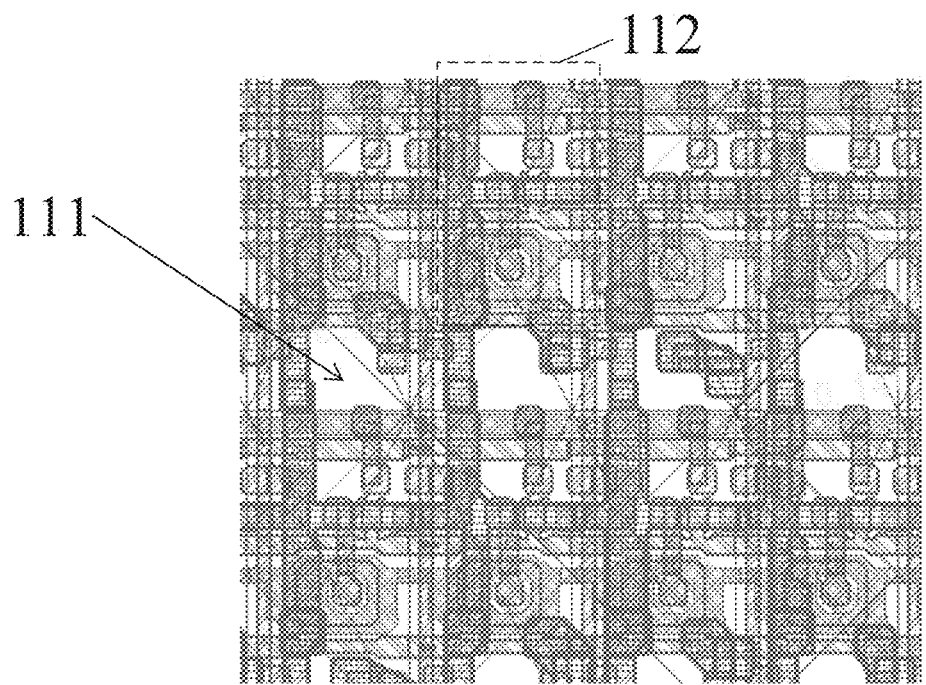
Figure 12:
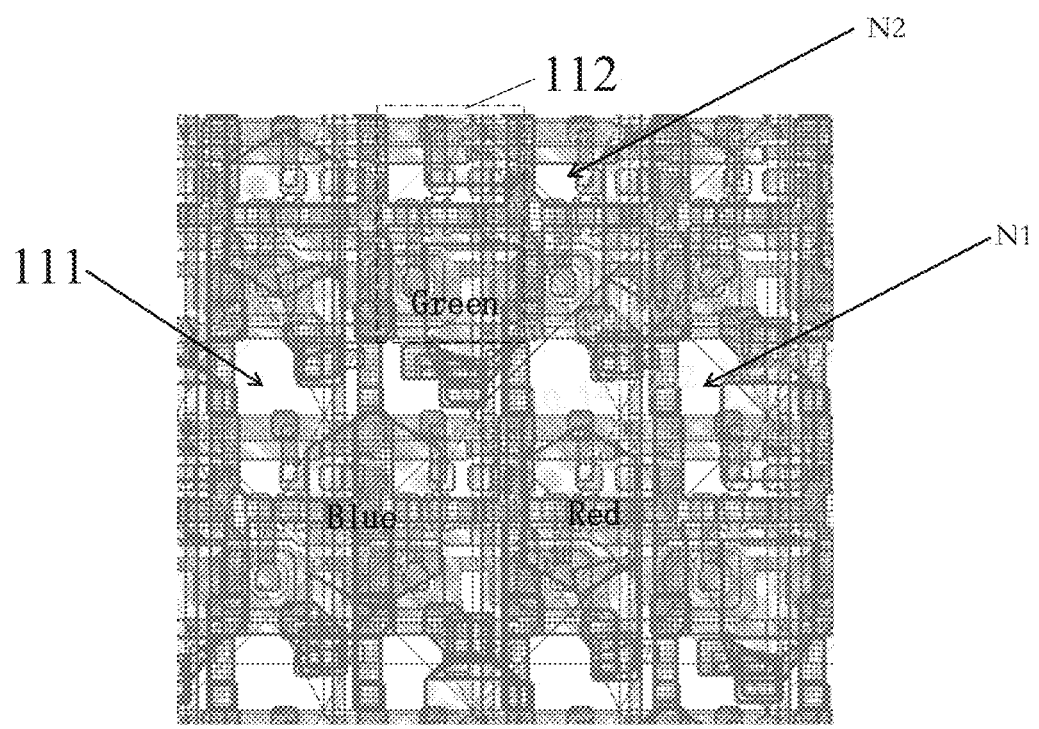

For example, FIGS. 8-12 show an example of layer structures of the display panel. For example, FIG. 8 shows a first conductive layer where the gate electrode G of the thin film transistor TFT and the first capacitor electrode CE1 of the storage capacitor Cst are located, FIG. 9 shows a layer structure formed by superimposing a second conductive layer where the second capacitor electrode CE2 of the storage capacitor Cst is located on the first conductive layer, FIG. 10 shows a layer structure formed by superimposing a third conductive layer where the source electrode S and the drain electrode D of the thin film transistor TFT are located on the second conductive layer, FIG. 11 shows a layer structure formed by superimposing a fourth conductive layer where a connection electrode is located on the third conductive layer, for example, the connection electrode may be an electrode connecting the thin film transistor (for example, the drain electrode of the thin film transistor) and the light-emitting device (for example, the first electrode of the light-emitting device), or an electrode connecting other circuit structures in the sub-pixel driving circuit. FIG. 12 is a layer structure formed by superimposing a fifth conductive layer where the first electrode (and the third electrode, the fifth electrode, etc.) of the light-emitting device of the sub-pixel is located on the fourth conductive layer. In this case, the positions of the light-transmitting portions 111 are respectively marked in FIGS. 8-12.

For example, the above-mentioned layer structure formed by a plurality of conductive layers constitutes a plurality of circuit patterns 112 that are periodically arranged, each circuit pattern 112 is implemented as a sub-pixel driving circuit. As shown in FIG. 12, the plurality of light-transmitting portions are formed between the plurality of circuit patterns 112, however, only the light-transmitting portion corresponding to the first light-transmitting opening 141 and meeting the above-mentioned size requirements is the above-mentioned light-transmitting portion 111 for transmitting the signal light. For example, a first light-transmitting portion N1 between the plurality of circuit patterns 112 and a second light-transmitting portion N2 located in the circuit pattern 112 are not used to transmit the signal light.

For example, in some embodiments, as shown in FIG. 3 and FIG. 12, the plurality of first light-transmitting openings 141 are arranged in an array, and in the same direction, a distance between any two adjacent first light-transmitting openings is identical, for example, in the horizontal direction in the figure, the distance between any two adjacent first light-transmitting openings 141 is the same, and in the vertical direction in the figure, the distance between any two adjacent first light-transmitting openings 141 is also the same. For example, in some examples, the distance between any two adjacent first light-transmitting openings 14 in the vertical direction may be equal to the distance between any two adjacent first light-transmitting openings 14 in the horizontal direction. As a result, the plurality of first light-transmitting openings 141 are evenly distributed in the display panel, so as to facilitate texture collection.

For example, in some embodiments, the plane shape of each of the plurality of first light-transmitting openings 141 may be a circle or a convex polygon (the convex polygon means that among all the sides of a polygon, when any one side extends infinitely at both ends to become a straight line, the other sides of the polygon are on the same side of the straight line), for example, a regular quadrilateral, a regular pentagon, or a regular hexagon, etc., to facilitate the formation of a regular texture image having a sufficient size on the image sensor 131.

For example, the display panel provided by the embodiments of the present disclosure may be an organic light emitting diode (OLED) display panel, or a quantum dot light emitting diode (QLED) display panel, etc., and the embodiments of the present disclosure do not limit this. The OLED display panel may be a flexible OLED display panel, for example. The OLED display panel has self-luminous characteristics, and the light emission of display pixel units of the OLED display can also be controlled or modulated as required, which can provide convenience for texture collection and help to improve the integration of the device.

For example, in some embodiments, the image sensor 131 may be a charge-coupled device (CCD) type image sensor, a complementary metal oxide semiconductor (CMOS) type image sensor, a photodiode, or other appropriate types of image sensors. According to requirements, the image sensor 131 may, for example, only sense light of a certain wavelength (for example, red light), or may sense all visible light. For example, the image sensor 131 is coupled to a processor (for example, an integrated circuit chip) through a wire, so that the collected texture image can be transmitted to the processor in the form of a data signal, and the processor can implement operations such as texture recognition. For example, the processor may be implemented by a general-purpose processor or a special-purpose processor, and the embodiments of the present disclosure do not limit this.

For example, the controller C in the embodiments of the present disclosure may be various types of integrated circuit chips having a processing function, may have various computing architectures, such as a complex instruction set computer (CISC) structure, a reduced instruction set computer (RISC) structure, or a structure that implements a combination of the plurality of instruction sets. In some embodiments, the controller C may be a microprocessor, such as an X86 processor or an ARM processor, or may be a digital processor (DSP) or the like.

For example, in some embodiments, the controller C may further include a memory, the memory is used for storing a control program for lighting a plurality of light sources to form photosensitive light sources, such as a control program for lighting a plurality of red sub-pixels to form the photo-sensitive light sources, etc. For example, the memory may be a storage medium of any form, such as a volatile memory or a non-volatile memory, such as a semiconductor memory or a magnetic medium memory, and the embodiments of the present disclosure do not limit this.

At least one embodiment of the present disclosure further provides a display device, and the display device includes any display panel provided by the embodiments of the present disclosure.

For example, the display device may be any product or component with a display function, such as a mobile phone, a tablet computer, a television, a monitor, a notebook computer, a digital photo frame, a navigator, etc., and the embodiments of the present disclosure do not limit this. The display device has high accuracy of texture recognition and a high speed of texture recognition.

The following several statements should be noted:
(1) The accompanying drawings involve only the structure(s) in connection with the embodiment(s) of the present disclosure, and other structure(s) can be referred to common design(s).
(2) For clarity, in accompanying drawings for illustrating the embodiment(s) of the present disclosure, the thickness of a layer or a region may be enlarged or reduced, that is, the drawings are not drawn in an actual scale. It should understood that, in the case that a component such as a layer, film, region, substrate or the like is referred to be "on" or "under" another component, it may be directly on or under the another component or a component is interposed therebetween.
(3) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, the protection scope of the present disclosure should be determined by the protection scope of the claims.

What is claimed is:

1. A display panel, having a first surface on a surface of the display panel, comprising:
   a driving circuit layer, comprising a pixel driving circuit;
   a light source array, on a side of the driving circuit layer close to the first surface, comprising a plurality of light sources, which are driven by the pixel driving circuit of the driving circuit layer during operation;
   a sensor array, on a side of the driving circuit layer away from the first surface, comprising a plurality of sensors, wherein the plurality of sensors are configured to receive light emitted from the plurality of light sources and reflected to the plurality of sensors by a structure on a side of the first surface away from the plurality of light sources; and
   a black matrix layer, on a side of the light source array close to the first surface, comprising a plurality of first light-transmitting openings and a plurality of second light-transmitting openings, wherein the plurality of first light-transmitting openings are configured to allow light, which is emitted from at least one of the plurality of light sources, emitted out from at least one of the plurality of second light-transmitting openings, and reflected by the structure, to pass through the plurality of first light-transmitting openings, to reach the plurality of sensors;
   wherein the driving circuit layer comprises a plurality of light-transmitting portions, and each of the plurality of first light-transmitting openings is arranged corresponding to at least one of the plurality of light-transmitting portions for transmitting light, and a plane size of one first light-transmitting opening in a direction parallel to the surface of the display panel is smaller than a plane size of one light-transmitting portion in the direction parallel to the surface of the display panel.

2. The display panel according to claim 1, wherein the one first light-transmitting opening and the one light-transmitting portion are arranged correspondingly, an orthographic projection of the one first light-transmitting opening in a direction perpendicular to the first surface and an orthographic projection of the one light-transmitting portion in the direction perpendicular to the first surface at least partially overlaps with each other.

3. The display panel according to claim 1, wherein the pixel driving circuit comprises a plurality of circuit patterns, and orthographic projections of the plurality of light-transmitting portions in the direction perpendicular to the first surface are not overlapped with orthographic projections of the plurality of circuit patterns in the direction perpendicular to the first surface;
the plurality of circuit patterns are respectively arranged in different layers.

4. The display panel according to claim 1, wherein the driving circuit layer is filled with a light-transmitting material at the plurality of light-transmitting portions.

5. The display panel according to claim 1, wherein in a first direction perpendicular to the surface of the display panel, a distance from a surface of the black matrix layer away from the first surface to the sensor array is $H_1$, a distance from the surface of the black matrix layer away from the first surface to the first surface is $H_2$, and $3 \geq H_2/H_1 \geq 1$.

6. The display panel according to claim 5, wherein the driving circuit layer comprises a semiconductor layer, and a distance from a surface of the semiconductor layer away from the first surface to the surface of the black matrix layer away from the first surface is $H_3$,
in a second direction parallel to the surface of the display panel, a size of a sensing region of a sensor is $D_1$, and a size of a light-transmitting portion is $D_2$, and $D_2 \geq H_3 * D_1/H_1$.

7. The display panel according to claim 6, wherein in the second direction parallel to the surface of the display panel, a size of a first light-transmitting opening is $D_m$, and a distance from a surface of the driving circuit layer away from the first surface to a surface of the black matrix layer close to the first surface is $H_m$, and $D_m = H_m * D_1/H_1 - D_2$.

8. The display panel according to claim 1, further comprising a pixel unit array, wherein the pixel unit array comprises a plurality of pixel units,
each of the plurality of pixel units comprises a plurality of sub-pixels, each of the plurality of sub-pixels comprises a light-emitting device, and
the plurality of light sources comprise light-emitting devices of the plurality of sub-pixels.

9. The display panel according to claim 8, wherein the plurality of second light-transmitting openings of the black matrix layer are a plurality of sub-pixel openings, the plurality of sub-pixel openings are arranged in one-to-one correspondence with the plurality of sub-pixels, so as to respectively transmit light emitted by the plurality of sub-pixels.

10. The display panel according to claim 9, wherein the plurality of first light-transmitting openings are arranged in one-to-one correspondence with the plurality of pixel units, or
each of the plurality of first light-transmitting openings is provided corresponding to a plurality of pixel units.

11. The display panel according to claim 10, wherein in a first light-transmitting opening and a pixel unit that are arranged correspondingly, the first light-transmitting opening and light-emitting layers of light-emitting devices of sub-pixels in the pixel unit do not overlap in a direction perpendicular to the first surface.

12. The display panel according to claim 11, wherein in the first light-transmitting opening and the pixel unit that are arranged correspondingly, a line connecting centers of light-emitting layers of two adjacent sub-pixels in the pixel unit and a center of the first light-transmitting opening do not overlap in the direction perpendicular to the first surface.

13. The display panel according to claim 8, wherein the plurality of sub-pixels comprised in each pixel unit comprise a red sub-pixel, a green sub-pixel, and a blue sub-pixel,
the red sub-pixel comprises a first light-emitting device, and the first light-emitting device comprises a first electrode, a second electrode, and a red light-emitting layer between the first electrode and the second electrode,
the green sub-pixel comprises a second light-emitting device, and the second light-emitting device comprises a third electrode, a fourth electrode, and a green light-emitting layer between the third electrode and the fourth electrode,
the blue sub-pixel comprises a third light-emitting device, and the third light-emitting device comprises a fifth electrode, a sixth electrode, and a blue light-emitting layer between the fifth electrode and the sixth electrode,
wherein in a first light-transmitting opening and a pixel unit that are arranged correspondingly, a distance from the first light-transmitting opening to the red light-emitting layer is smaller than a distance from the first light-transmitting opening to the green light-emitting layer and a distance from the first light-transmitting opening to the blue light-emitting layer.

14. The display panel according to claim 13, further comprising a controller, wherein the controller is configured to light up red sub-pixels in the plurality of pixel units to serve as photosensitive light sources of the plurality of sensors.

15. The display panel according to claim 13, wherein in a first direction perpendicular to the surface of the display panel, a distance from a surface of the black matrix layer away from the first surface to the sensor array is $H_1$, the driving circuit layer comprises a semiconductor layer, and a distance from a surface of the semiconductor layer away from the first surface to the surface of the black matrix layer away from the first surface is $H_3$, a distance from the surface of the black matrix layer away from the first surface to a surface of the green light-emitting layer or the blue light-emitting layer close to the first surface is $H_4$,
in a second direction parallel to the surface of the display panel, a size of a sensing region of a sensor is $D_1$, and a distance from the light-transmitting portion to the green light-emitting layer or the blue light-emitting layer is L, and $L \geq (H_3-H_4)*D_1/(2*H_1)$.

16. The display panel according to claim 15, wherein $L \leq (2H_3-H_4)*D_1/H_1$.

17. The display panel according to claim 1, further comprising a touch control layer on a side of the black matrix layer away from or close to the light source array,
wherein in a first direction perpendicular to the surface of the display panel, portions of the touch control layer overlapping with the plurality of first light-transmitting openings are light-transmissive; or
the touch control layer comprises an opaque material, an orthographic projection of the opaque material in a direction perpendicular to the first surface does not overlap with orthographic projections of the plurality of first light-transmitting openings and the plurality of light-transmitting portions in the direction perpendicular to the first surface.

18. The display panel according to claim 1, wherein the plurality of first light-transmitting openings are arranged in an array, and in a same direction, a distance between any two adjacent first light-transmitting openings is identical;
a plane shape of each of the plurality of first light-transmitting openings is a circle or a convex polygon.

19. A display device, comprising the display panel according to claim 1.

20. A display panel, having a first surface on a surface of the display panel, comprising:
a driving circuit layer, comprising a pixel driving circuit;
a light source array, on a side of the driving circuit layer close to the first surface, comprising a plurality of light sources, which are driven by the pixel driving circuit of the driving circuit layer during operation;
a sensor array, on a side of the driving circuit layer away from the first surface, comprising a plurality of sensors, wherein the plurality of sensors are configured to receive light emitted from the plurality of light sources and reflected to the plurality of sensors by a structure on a side of the first surface away from the plurality of light sources; and
a black matrix layer, on a side of the light source array close to the first surface, comprising a plurality of first light-transmitting openings and a plurality of second light-transmitting openings, wherein the plurality of first light-transmitting openings are configured to allow light, which is emitted from at least one of the plurality of light sources, emitted out from at least one of the plurality of second light-transmitting openings, and reflected by the structure, to pass through the plurality of first light-transmitting openings, to reach the plurality of sensors;
wherein the driving circuit layer comprises a plurality of light-transmitting portions, and each of the plurality of first light-transmitting openings is arranged corresponding to at least one of the plurality of light-transmitting portions for transmitting light, and a plane size of one first light-transmitting opening in a direction parallel to the surface of the display panel is smaller than a plane size of one light-transmitting portion in the direction parallel to the surface of the display panel;
the display panel further comprises a touch control layer on a side of the black matrix layer away from or close to the light source array, the touch control layer comprises a metal grid, an orthographic projection of the metal grid in a direction perpendicular to the first surface is not overlapped with orthographic projections of the plurality of first light-transmitting openings and the plurality of light-transmitting portions in the direction perpendicular to the first surface, and the metal grid is provided between adjacent light sources.

* * * * *